(12) United States Patent
Nakaizumi

(10) Patent No.: US 6,249,173 B1
(45) Date of Patent: Jun. 19, 2001

(54) TEMPERATURE STABILIZING CIRCUIT

(75) Inventor: Kazuo Nakaizumi, Tokyo (JP)

(73) Assignee: Ando Electric Co., Ltd., Tokyo (JP)

( * ) Notice: Subject to any disclaimer, the term of this patent is extended or adjusted under 35 U.S.C. 154(b) by 0 days.

(21) Appl. No.: 09/400,273

(22) Filed: Sep. 21, 1999

(30) Foreign Application Priority Data

Sep. 22, 1998 (JP) .................................. 10-268701

(51) Int. Cl.[7] .......................... H03K 17/78; H01L 35/00
(52) U.S. Cl. ............................................................ 327/513
(58) Field of Search ................................... 327/512, 513, 327/538, 540, 544

(56) References Cited

U.S. PATENT DOCUMENTS

| | | | | |
|---|---|---|---|---|
| 4,587,478 | * | 5/1986 | Kasperkovitz et al. | 323/316 |
| 5,440,520 | * | 8/1995 | Schutz et al. | 365/226 |
| 5,723,998 | * | 3/1998 | Saito et al. | 327/513 |
| 6,049,221 | * | 4/2000 | Ishibashi et al. | 326/30 |

* cited by examiner

Primary Examiner—My-Trang Nuton
(74) Attorney, Agent, or Firm—Finnegan, Henderson, Farabow, Garrett & Dunner, L.L.P.

(57) ABSTRACT

In a temperature stabilizing circuit, a reference temperature detecting means 11 converts the highest value of the junction temperature of and LSI 1 into a reference pulse number, and stores it. An operating temperature detecting means 12 converts the junction temperature of the LSI at the time of operation into an operating pulse number, and stores it. A current control means 13 subjects the operating pulse number and the reference pulse number to comparison, and increases or decreases an operating current flowing to a T. G. 10 so that the operation pulse number be equal to the reference pulse number, thereby to control the junction temperature. As a result, the jitter value of the timing generator made up of a CMOS gate array is greatly decreased.

3 Claims, 6 Drawing Sheets

TEMPERATURE STABILIZING CIRCUIT

BACKGROUND OF THE INVENTION

1. Field of the Invention

This invention relates to an LSI circuit, and more particularly to a temperature stabilizing circuit adapted to stabilize the junction temperature of an LSI.

2. Description of the Related Art

A conventional timing generator (hereinafter referred to merely as "a T. G.", when applicable) made up of a CMOS gate array is so designed that, in the case where it is used in an LSI tester, the user can change an operating frequency every cycle at the time of measurement.

This will be described with reference to the drawing in detail. FIG. 6 is a block diagram showing a conventional T. G. made up of a CMOS gate array. FIG. 7 is a diagram indicating junction temperature and tpd in a conventional T. G. The term "tpd" as herein used is intended to mean a time difference between an input signal applied to a T. G. 61 shown in FIG. 6 and an output signal outputted by the T. G. 61. The thermal resistance of the package is 7.5° C./W, the power consumption is 1 W, and the peripheral temperature is 25°.

In FIG. 7, at the time instant t60, the supply voltage of the LSI is an optional one. Next, when at the time instant t62 the operation is stated with 1 µs, then the junction temperature becomes 32.5° C. at the time instant t63. On the other hand, the tpd becomes 810 ps from 770 ps; that is, the tpd increases by 40 ps. Next, when at the time instant t64 the operation is started with 100 ns, then at the time instant t65 the junction temperature becomes 47.5° C., while the tpd becomes 850 ps. Furthermore, when at the time instant t66 the operation is started with 10 ns, then at the time instant t67 the junction temperature becomes 100° C., while the tpd becomes 1 ns.

In the prior art, as was described above, the T. G. 61 made up of the CMOS gate array is mounted on an LSI tester. When the user changes the operating frequency in one test, the power consumption is changed, the junction temperature is changed, and the tpd is greatly changed. And, if the tpd is greatly changed with time, the jitter value is increased, and the rated value of the LSI tester becomes worse. For instance, in FIG. 7, with the operating frequencies of 1 µs and 10 ns, the jitter value is 230 ps. As is apparent from the above description, when the operating frequency of the T. G. 61 changes, the operating current is changed, and the junction temperature is changed. And the tpd of the T. G. 61 changes, and the jitter value, which is important for the LSI tester, becomes more than the rated value.

SUMMARY OF THE INVENTION

In view of the foregoing, an object of the invention is to provide a temperature stabilizing circuit which stabilizes the junction temperature of a timing generator made up of a CMOS gate array, and decreases the jitter value.

In order to achieve the foregoing object, according to the invention, there is provided a temperature stabilizing circuit comprising:

reference temperature obtaining means for obtaining a reference pulse number corresponding to the junction temperature under the condition that the junction temperature of an LSI reaches the highest value;

operating temperature obtaining means for obtaining an operating pulse number according to the junction temperature of the LSI when the LSI is in an ordinary operating state; and current control means which, when the LSI is in the ordinary operating state, controls the operating current of the LSI so that the operating pulse number of the operating temperature obtaining means be equal to the operating pulse number of the reference temperature obtaining means.

According to a second aspect of the invention, there is provided the temperature stabilizing circuit of the first aspect of the invention, further comprising: signal forming means for forming a signal having a period corresponding to the junction temperature of the LSI according to a pulse signal of fixed period which is applied to the LSI;

wherein the reference temperature obtaining means comprises a first counter which, with the junction temperature at the highest temperature, counts the pulse signal of fixed period with the period of a signal formed by the signal forming means, and wherein the operating temperature obtaining means comprises a second counter which, the LSI in an ordinary operating state, counts the pulse signal of fixed period with the period of a signal formed by the signal forming means.

According to a third aspect of the invention, there is provided the temperature stabilizing circuit of the first aspect of the invention wherein the current control means comprises:

a comparison circuit which compares the operating pulse number provided by the operating temperature obtaining means with the reference pulse number provided by the reference temperature obtaining means; and current control circuit for increasing or decreasing the operating current to the LSI according to the difference between the reference pulse number and the operating pulse number which is provided by the comparison circuit.

In the invention, the reference temperature obtaining means obtains the reference pulse number corresponding to the junction temperature with the junction temperature of the LSI at the highest value. For instance, the signal forming means forms a signal having a period corresponding to the junction temperature of the LSI on the basis of the pulse signal of fixed period which is applied to the LSI; and with the junction temperature at the highest the first counter counts the aforementioned pulse signal of fixed period with the period of the signal formed by the aforementioned signal forming means, thereby to obtain the reference pulse number.

In the ordinary operating state, the operating temperature obtaining means obtains the operating pulse number corresponding to the junction temperature of the LSI during the normal operation. For instance, the second counter counts the aforementioned pulse signal of fixed period with the period of the signal which, in the normal operating state of the LSI, is formed by the signal forming means, thereby to obtain the operating pulse number. And, during normal operation, the current control means controls the operating current of the LSI so that, during normal operation, the operating pulse number of the operating temperature obtaining means be equal to the reference pulse number of the reference temperature obtaining means.

For instance, the comparison circuit subjects the reference pulse number of the reference temperature obtaining means and the operating pulse number of the operating temperature obtaining means to comparison, and the current control circuit increases or decreases the operating current flowing to the LSI according to the difference between the reference pulse number and the operating pulse number which is obtained by the comparison circuit. That is, if the operating pulse number is larger than the reference pulse number, the amount of current of the current control circuit is increased thereby to increase the junction temperature; on the other hand, the operation pulse number is smaller than the reference pulse number, the amount of current of the current control circuit is decreased thereby to decrease the junction temperature. Hence, the junction temperature is stabilized, and the jitter value is decreased.

DETAILED DESCRIPTION OF THE PREFERRED EMBODIMENTS

A preferred embodiment of the invention will be described with reference to the accompanying drawings.

Figure 1:
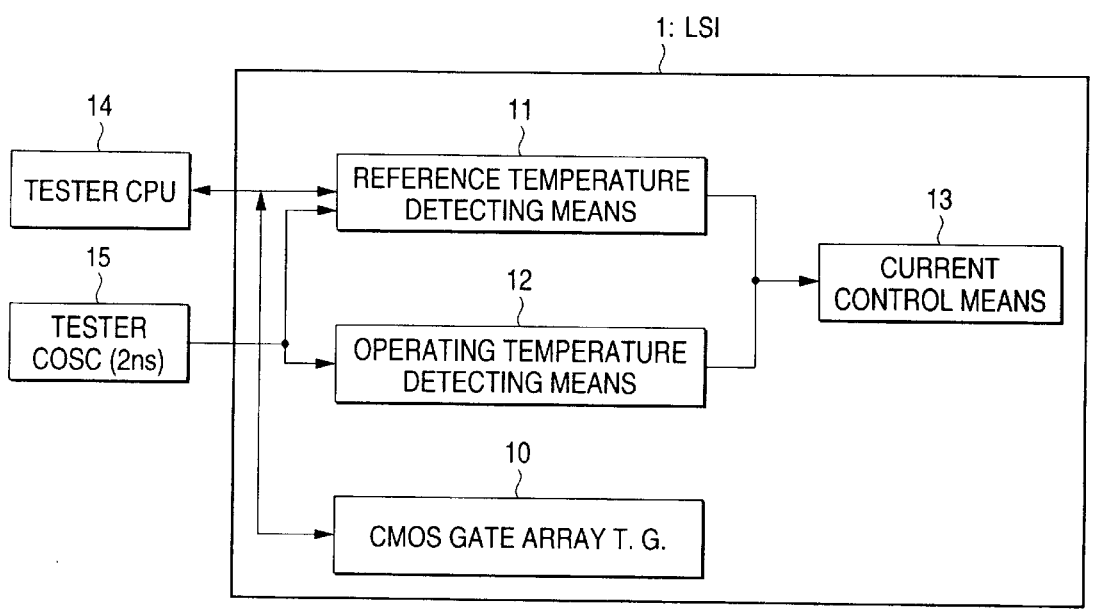
FIG. 1 is a block diagram showing the arrangement of an LSI according to an embodiment of the invention.

FIG. 1 is a block diagram showing the arrangement of an LSI according to the embodiment of the invention. In FIG. 1, a reference temperature detecting means 11 converts the maximum value of the junction temperature of the LSI into an operating pulse number, and stores it. An operating temperature detecting means 12 converts the junction temperature of the LSI in operation into an operating pulse number, and stores the it. A current control means 13 compares the operating pulse number with the reference pulse number, and controls the junction temperature by increasing or decreasing the operating current to the T. G. 10 so that the operating pulse number be equal to the reference pulse number.

Figure 2:
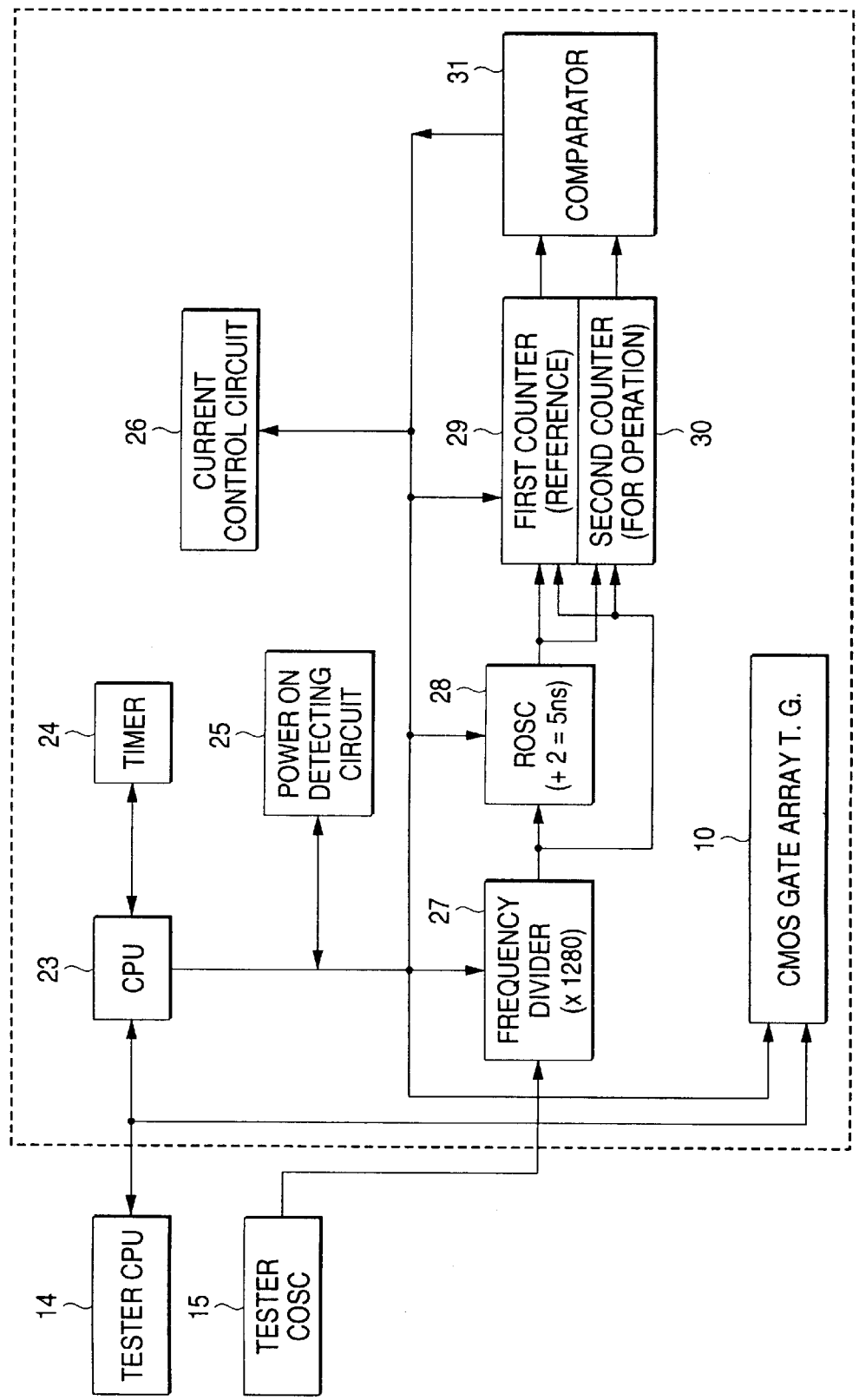
FIG. 2 is a block diagram showing the arrangement of the LSI in detail.

FIG. 2 is a block diagram showing the arrangement of the LSI 1 (shown in FIG. 1) in detail. In the circuit shown in FIG. 2, a CPU 23 controls the whole LSI. A timer 24 measures the lapse of time after the power switch is turned on. A power on detecting circuit 25 detects when the power switch for the LSI is turned on, to supply a predetermined signal to the CPU 23. A frequency divider 27 frequency-divides the signal of the tester COSC 15 with a crystal oscillation signal frequency divider 1280 times as high, and supplies it to a ring oscillator (ROSC) 28.

The ROSC 28 operates according to the signal thus frequency-divided; that is, the ROSC 28 forms a pulse signal having a frequency which changed according to the junction temperature of the LSI, and supplies the pulse signal to a first counter 29 and a second counter 30. The first counter 29 counts a frequency-divided signal with the period of a pulse signal formed by the ROSC 28 in the highest speed operation, and stores it as a reference pulse number CR. In other words, the reference pulse number CR is a pulse number obtained when the junction temperature of the LSI reaches the highest value.

The second counter 30, in an ordinary operation condition, counts a frequency-divided signal with the period of a pulse signal formed by the ROSC 28, and stores it as an operating pulse number CO. In other words, the operating pulse number CO changes as the user changes the operating pulse number. A comparator 31 subtracts the pulse numbers of the first counter 29 and the second counter 30, and supplies the result of comparison to the current control circuit 26. In the embodiment, the comparator 31 supplies the result of comparison as digital data of 10 bits. The current control circuit 26 controls the amount of current of the T. G. 10 according to the result of comparison (the difference between the reference pulse number and the operating pulse number).

Figure 3:
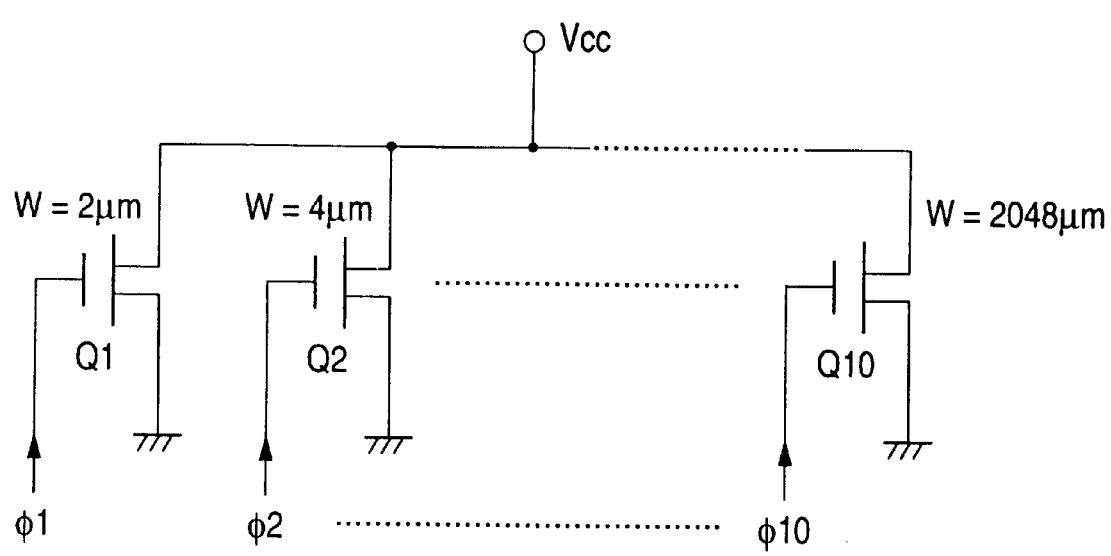
FIG. 3 is a block diagram showing the arrangement of a current measuring circuit.

FIG. 3 is a circuit diagram showing an example of the above-described current control circuit. As shown in FIG. 3, the current control circuit 26 is made up of FETs Q1, Q2, . . . and Q10 which are connected between a supply voltage Vcc and ground. The FETs Q1 through Q10 are on/off-controlled according to the difference between the pulse numbers of the first counter 29 and the second counter 30, so that the current of a chip temperature control circuit (not shown) is controlled. As a result, the junction temperature of the LSI is changed, and the tpd is changed within a predetermined ranged.

Figure 4:
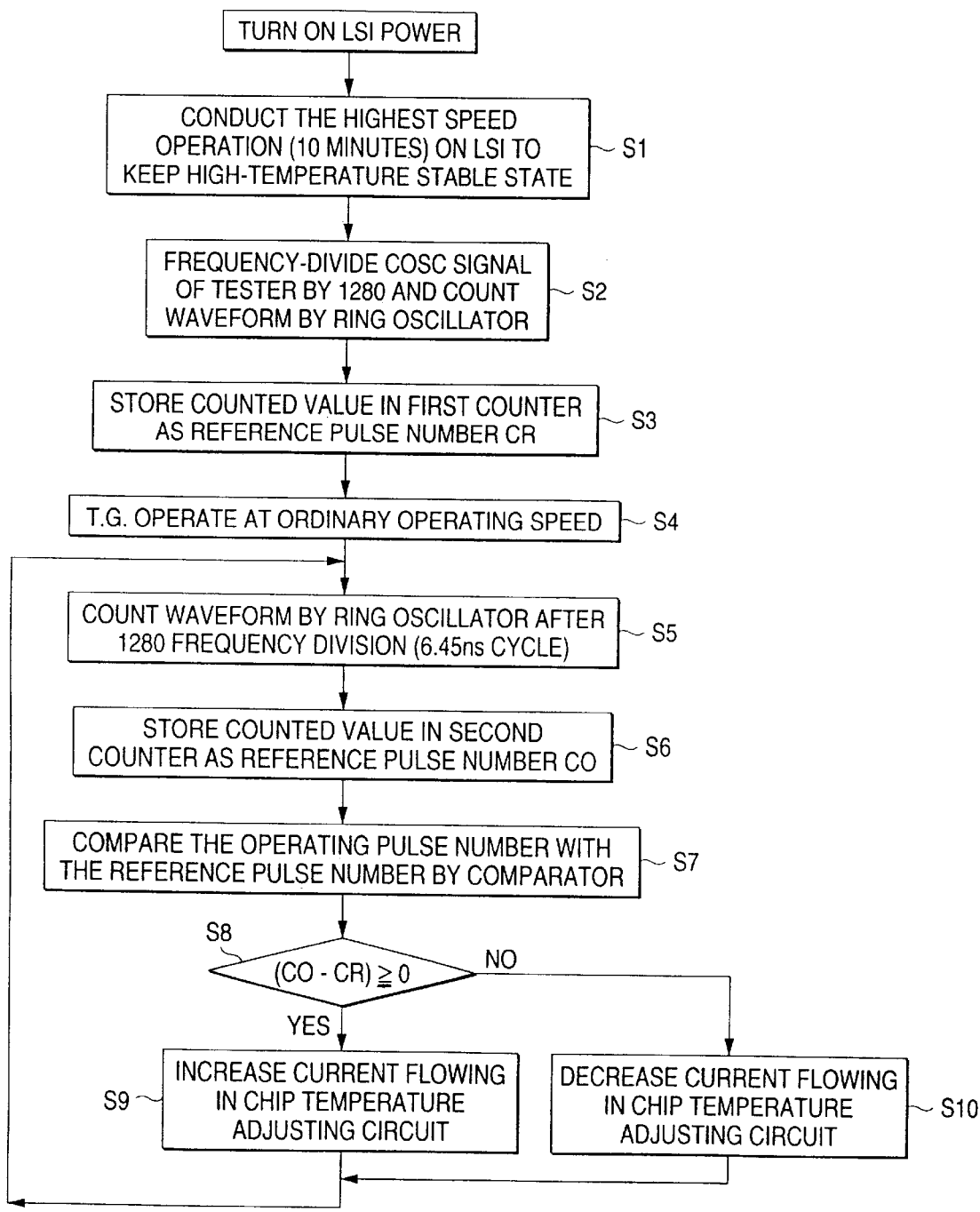
FIG. 4 is a flow chart for a description of the operation of a temperature stabilizing circuit.
Figure 5:
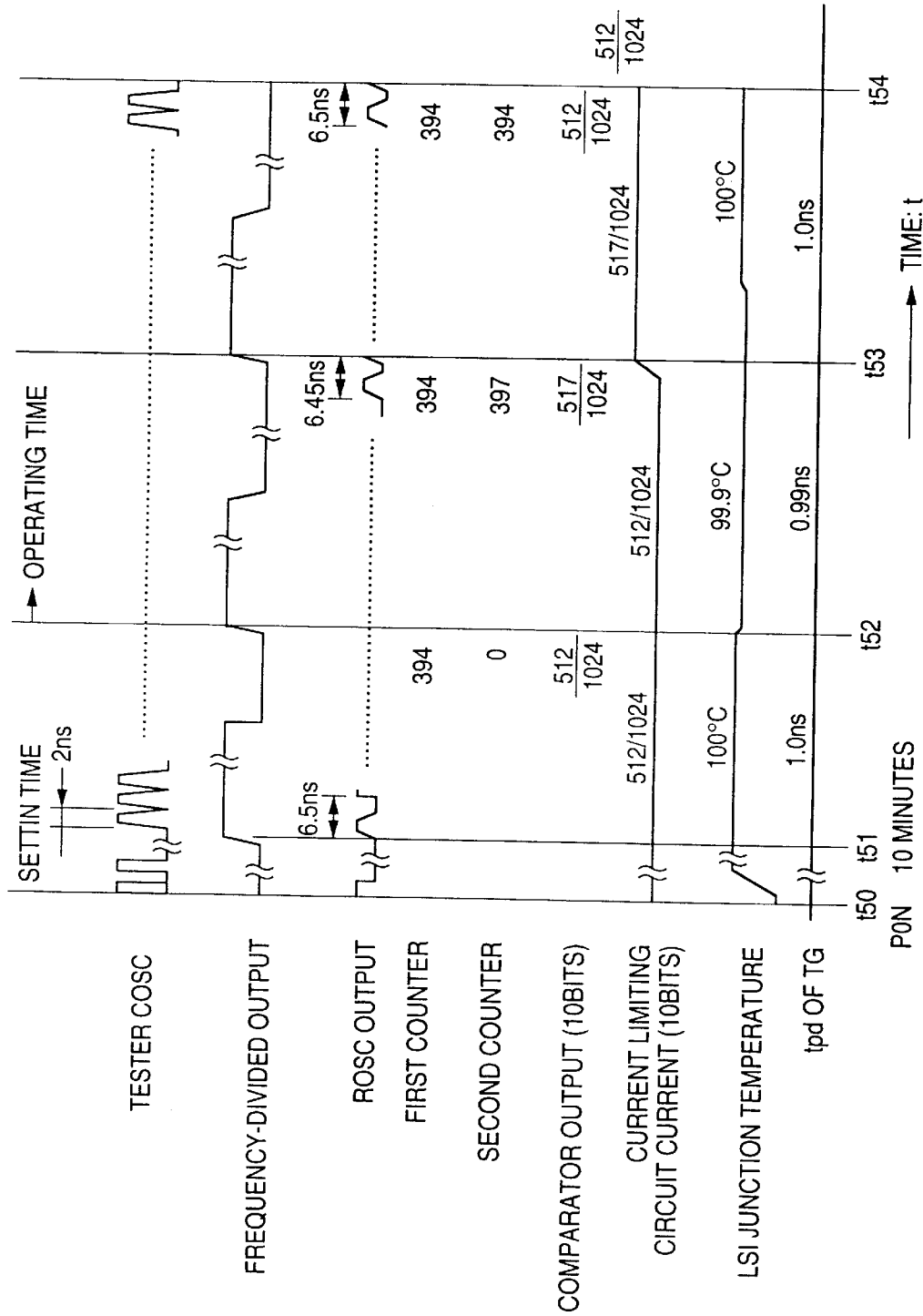
FIG. 5 is a timing chart for a description of operation timing.

Next, the whole operation of the embodiment will be described with reference to FIG. 4, a flow chart, and FIG. 5, a timing chart. When the power switch of the LSI is turned on at the time instant t50 (shown in FIG. 5), the power on detecting circuit 25 is operated, and a signal is supplied to the CPU 23. The latter 23 transmits an instruction to the timer 24 to cause the latter 24 to perform a time measurement for ten minutes, and to cause the T. G. 10 to perform the highest speed operation (Step S1). When the timer 24 measures ten (10) minutes; that is, at the time instant t51, the junction temperature of the LSI reaches the highest temperature 100° C. In this case, the waveform obtained by frequency-dividing the signal of the COSC 15 of the tester with the frequency divider 1280 times as high, is counted with the period (about 6.5 ns) of the ROSC 28 by the first counter 29 (Step S2), and is stored as the reference pulse number (2 ns×1280/6.5 ns=394) CR (Step S3).

Next, at the time instant t52, the T. G. 10 is operated at the ordinary operating speed (Step S4). When the operation becomes the ordinary high speed operation, the junction temperature is decreased by 0.1° C.; that is, it becomes 99.9° C. As the junction temperature is decreased to 99.9° C., the period of the ROSC 28 becomes 6.45 ns. In this case, the waveform frequency-divided by the frequency divider 27 is counted with the period (about 6.45 ns) of the ROSC 28 by the second counter (Step S5), and is stored as an operating pulse number (2 ns×1280/6.45 ns) CO (Step S6). In this case, the tpd of the T. G. 10 becomes 0.99 ns.

In the comparator 31, the operating pulse number (397) of the second counter 30 is compared with the reference pulse number (394) of the first counter 29 (Step S7), and a signal corresponding to the difference between them is supplied to the current control circuit 26. In the current control circuit 26, it is determined whether the difference between the reference pulse number CR and the operating pulse number CO is positive or whether it is negative (Step S8). If it is positive ($\geq 0$), then the current of the chip temperature adjusting circuit is increased (Step S9), and if it is negative ($\leq 0$), then the current of the chip temperature adjusting circuit is decreased (Step S10). More specifically, at the time instant t53, with the aid of the signal (517/1024 (10 bits) corresponding to the difference between the reference pulse number CR and the operating pulse number CO, the current of the chip temperature adjusting circuit is controlled.

That is, the 10-bits data corresponds to signals Φ1 through Φ10 of the current control circuit 26. In this case, the FETs Q1, Q2 and Q10, to which the signals Φ1, Φ2 and Φ10 are applied, are placed in an "on" state, and the operating current to the LSI is increased. And when, at the time instant t54, the junction temperature of the LSI returns to 100° C., then the operating pulse number CO of the second counter 30 becomes 394; that is, it becomes equal to the reference pulse number CR of the first counter 29, and the tpd of the T. G. 10 is also returned to 1.0 ns. When the pulse numbers of the two counters become equal to each other, the output of the comparator 31 becomes 512/1024, and of the data of 10 bits, only the FET Q10 corresponding to Φ10 is placed in "on" state, and the operating current to the LSI is decreased.

Figure 6:
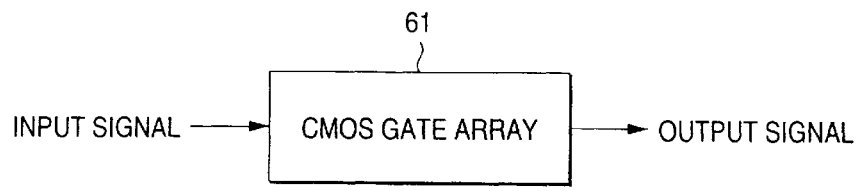
FIG. 6 is a block diagram showing the arrangement of a conventional LSI.
Figure 7:
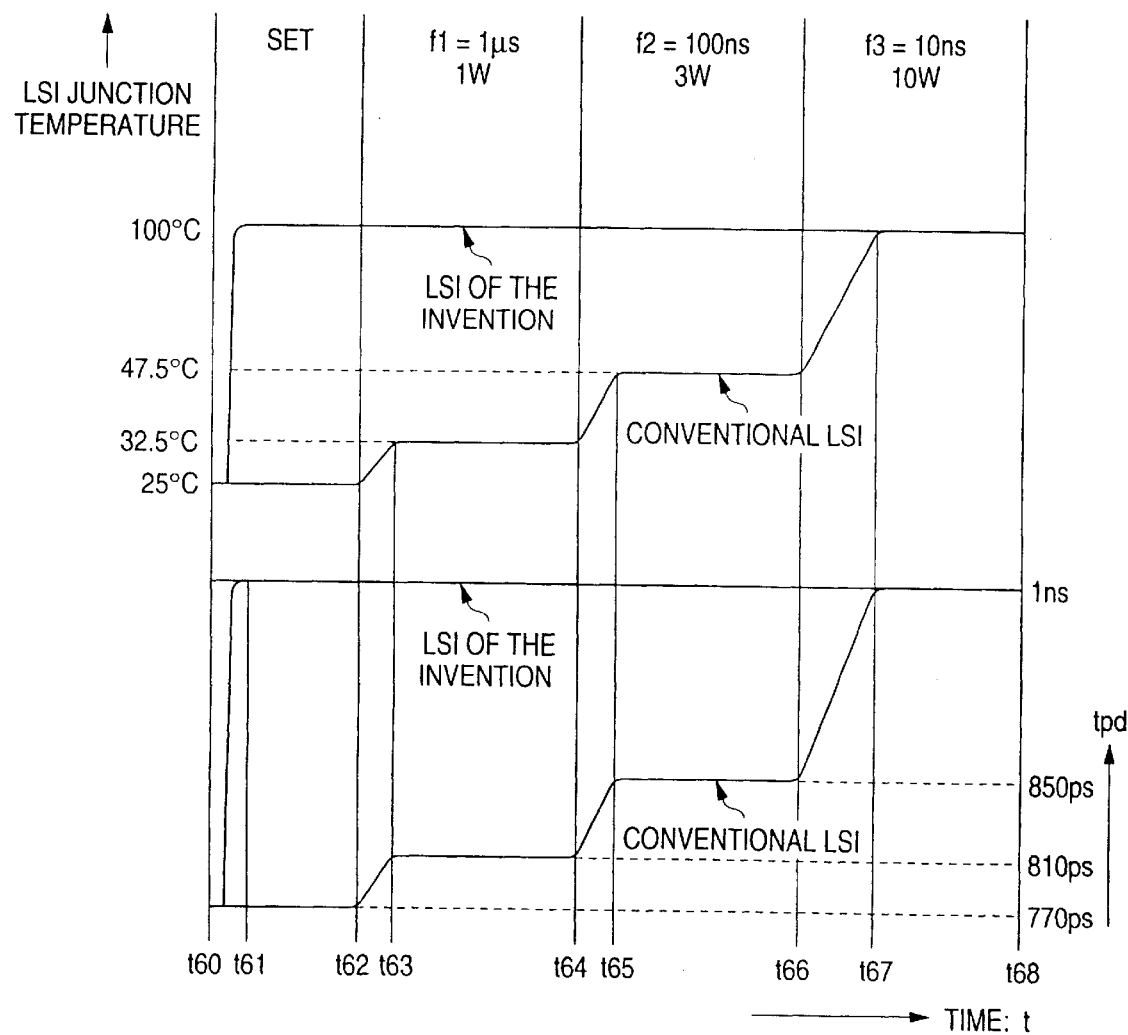
FIG. 7 is a graphical representation for a description of relationships between junction temperatures and tpd's of the conventional LSI.

As was described above, in the embodiment, the reference pulse number CR and the operating pulse number are subject to comparison, and the current of the current control circuit is controlled according to the difference between the two pulse numbers with the data having a resolution of 10 bits. Hence, as shown in FIG. 6, with the conventional CMOS T. G. 10, the junction temperature is greatly changed with the operating frequency, so that the tpd is changed, whereby the jitter value is as large as 230 ps. On the other hand, as shown in FIG. 5, the junction temperature is detected with 0.1° C. to control the current, so that the range of change of tpd can be limited in 10 ps. Hence, in the case where the result of operation of the embodiment is compared with the conventional relation between junction temperature and tpd (as shown in FIG. 7) it can be understood that, even if the user changes the operating frequency, the junction temperature and the tpd are not greatly changed; that is, they are stable. And, since the tpd is not greatly changed, the jitter value is decreased.

As was described above, according to the invention, the reference temperature obtaining means obtains the reference pulse number corresponding to the junction temperature of the LSI with the junction temperature of the LSI at the highest value; and the current control means obtaining controls the operating current of the LSI so that, at the time of operation, the operating pulse number provided by the operating temperature obtaining means is equal to the reference pulse number provided by the reference temperature obtaining means. Therefore, the junction temperature of the timing generator made up of the CMOS gate array is stabilized, and the jitter value is decreased.

What is claimed is:

1. A temperature stabilizing circuit, comprising:

reference temperature obtaining means for obtaining a reference pulse number corresponding to a junction temperature of an LSI under the condition that said junction temperature of said LSI reaches the highest value;

operating temperature obtaining means for obtaining an operating pulse number according to said junction temperature of said LSI when said LSI is in an ordinary operating state; and current control means for controlling the operating current of said LSI so that said operating pulse number of said operating temperature obtaining means is equal to said operating pulse number of said reference temperature obtaining means when said LSI is in said ordinary operating state.

2. A temperature stabilizing circuit as claimed in claim 1, further comprising: signal forming means which, according to a pulse signal of fixed period which is applied to said LSI, forms a signal having a period corresponding to the junction temperature of said LSI;

wherein said reference temperature obtaining means comprises a first counter which, with said junction temperature at the highest temperature, counts said pulse signal of fixed period with the period of a signal formed by said signal forming means; and wherein said operating temperature obtaining means comprises a second counter which, said LSI in an ordinary operating state, counts said pulse signal of fixed period with the period of a signal formed by said signal forming means.

3. A temperature stabilizing circuit as claimed in claim 1, wherein said current control means comprises:

a comparison circuit which compares said operating pulse number provided by said operating temperature obtaining means with said reference pulse number provided by said reference temperature obtaining means; and a current control circuit for increasing or decreasing said operating current to said LSI according to the difference between said reference pulse number and said operating pulse number which is provided by said comparison circuit.

* * * * *